Aug. 13, 1968 D. I. POMERANTZ 3,397,278

ANODIC BONDING

Filed Oct. 3, 1966 4 Sheets-Sheet 1

INVENTOR
DANIEL I. POMERANTZ
BY
ATTORNEY

INVENTOR
DANIEL I. POMERANTZ
BY
Robert Levine
ATTORNEY

INVENTOR
DANIEL I. POMERANTZ
BY
Robert Lewis
ATTORNEY

INVENTOR
DANIEL I. POMERANTZ
BY
Robert Cummings
ATTORNEY 3,397,278

ANODIC BONDING

Daniel I. Pomerantz, Lexington, Mass., assignor to P. R. Mallory & Co., Inc., Indianapolis, Ind., a corporation of Delaware Continuation-in-part of application Ser. No. 453,600, May 6, 1965. This application Oct. 3, 1966, Ser. No. 583,907
23 Claims. (Cl. 174—52)

ABSTRACT OF THE DISCLOSURE

An inorganic insulator element of normally high electrical resistivity is bonded to a metallic element by placing the substantially smooth and complemental adjoining surfaces of the elements in contact, heating the insulator element to increase its electrical conductivity and applying a potential across the elements thereby producing an electric current through the elements and creating an electrostatic field whereby the elements are brought into intimate contact with each other and a bond is formed. The foregoing is useful, for example, to encapsulate a planar surface of a silicon semiconductor device with a glass.

The present invention relates to semiconductor devices and more particularly relates to a novel method of bonding metals including semiconductors to insulators and the product thereof. This application is a continuation-in-part of my copending application, application Ser. No. 511,771 filed Dec. 6, 1965 which in turn is a continuation-in-part of my copending application Ser. No. 453,600, filed May 6, 1965. Both of these applications are now abandoned.

One aspect of bonding metals to insulators involves semiconductor devices having diffused p-n junctions. In such semiconductor devices it is well known that the exposed boundaries are extremely sensitive to environmental conditions, and it has become general practice to provide protection in the form of controlled ambients or coatings. In order to provide this protection for semiconductor p-n junction devices, commercial development has led to the provision of costly and complex housings or enclosures which protect the p-n junction but prevent full realization of the full advantage of semiconductor devices. It is known in the art to use the semiconductor material as an integral part of the encapsulation. However, this structure leads to complexities in regard to the attachment of external leads and the use of metal part members which increase the cost and fabrication effort for such devices. It is also known in the art to enclose the planar surfaces of silicon semiconductor devices by sandwiching a ring of hard glass between the silicon wafer containing the diffused junctions and a plain silicon wafer to be used as a cap, metallizing the surfaces to be bonded, and creating a bond by exposing the assembly to temperature sufficient to cause a heat bond. A glass-to-semiconductor seal is thereby provided by causing sufficient melting of the materials so that bonding occurs. However, as the surfaces to be bonded must be first plated with a metal, usually gold, the resulting bond is actually a glass-to-metal seal. While this method eliminates the step of soldering the metallized surfaces, it is still cumbersome and requires a number of complicated steps.

Therefore, it is an object of the present invention to provide an improved method of encapsulating the planar surfaces of silicon semiconductor devices and monolithic circuits having diffused p-n junctions which overcomes the disadvantages of prior art.

It is an object of the present invention to reduce the number of parts used in semi-conductor p-n junction devices and monolithic circuits.

It is an object of the present invention to reduce the number of steps and hence the time in the fabrication of semiconductor p-n junction devices and monolithic circuits.

In its more general aspects the present invention concerns the bonding of an electrically conductive element to an insulator element. As will be seen from the various specific examples described herein the electrically conductive element may be a metal of high conductivity such as aluminum or a metal of lower conductivity such as silicon commonly referred to as a semiconductor. The insulator element is of the type or character comprised of inorganic material having normally at room temperature a relatively high electrical resistivity but capable of being rendered moderately conductive at elevated temperatures. The various glasses are illustrative of the insulators contemplated.

In accordance with the foregoing it is an object of the present invention to provide a method of bonding an insulating material directly to a conductive material, a semiconductor material, a semiconductor device or a monolithic circuit, thus eliminating the steps of metal plating the surfaces to be bonded and the soldering or heat fusing of the metallized surfaces to effect connections therebetween.

The present invention, in another of its aspects, relates to novel features of the instrumentalities described herein for attaining the principal object of the invention and to the novel principles employed in the instrumentalities whether or not these features and principles may be used in the said object and/or in the bonding field.

Other objects of the invention and the nature thereof will become apparent from the following description considered in conjunction with the accompanying drawing and wherein like reference numbers describe elements of similar function therein.

For illustrative purposes, the invention will be described in conjunction with the accompanying drawing in which:

FIGURE 1 is a cross-sectional view of the simple method of bonding a semiconductor to an insulator;

FIGURE 1*a* is a fragmentary cross-sectional view, on an enlarged scale, of a typical relation at the interface of a semiconductor and an insulator such as shown in FIGURE 1 in the process of being bonded;

Figure 1:
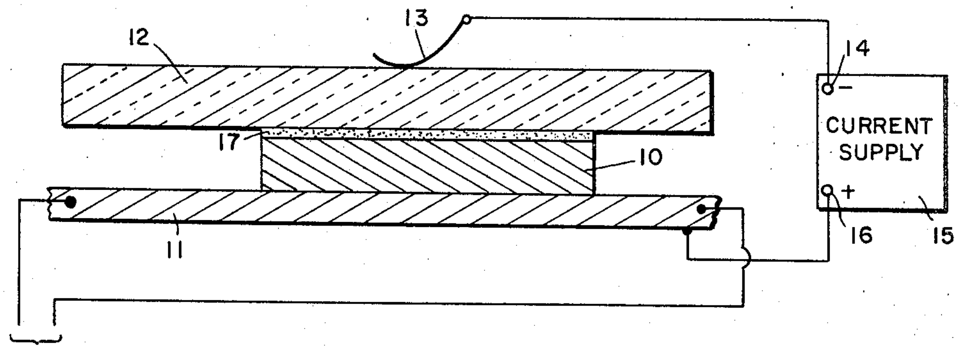
Figure 1A:
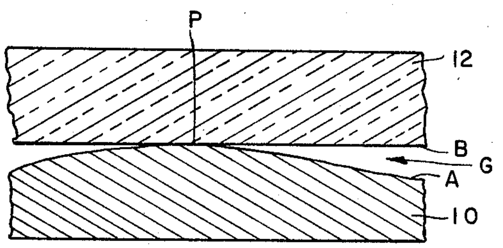

FIGURES 1 and 1*a* illustrate the general principles of the invention. In accordance therewith an insulator such as a borosilicate glass and a semiconductor such as silicon are brought into close surface contact, the juxtaposed surfaces being smooth and flat, the insulator is heated sufficiently to render it electrically conductive. When the insulator is borosilicate glass such as obtainable from the Corning Glass Works under the trademark "Pyrex," a temperature range of about 300° C. to 700° C. may be employed to render the glass suitably conductive. A bond is then effected by applying an electric power source across the assembled unit producing a small current flow. A current of low amperage is sufficient. It will be noted also that the temperatures employed are below the softening points of the glass and similarly below the melting points of the metals. In a typical example with a semiconductor of silicon and an insulatng material of borosilicate glass the bond is effected by a current of 10 microamperes/mm.$^2$ for a period of about one minute. The process is clearly distinguishable from electrical welding as the joule heat developed is not sufficient to create any fusion in gross of materials. In the present invention substantial fusion by application of heat is avoided. Thus it will be understood that the magnitude of electrical current employed in the practice of this invention may be denominated as current of low density.

It will be understood that the temperatures employed are those which are required to be met in order to render the insulator material sufficiently electrically conductive to permit the passage of a finite current. It is this small electric current which produces the bonding phenomena in a bonding or transition zone at the interface between the insulator and the semiconductor or conductor.

Although the values 10 microamperes/mm.$^2$ for one minute are used above in describing the present invention, the current and time may be varied infinitely, so long as the current-time product is sufficient for bonding growth. The values of current density and time will vary dependent upon the materials being bonded and the temperature employed. For example, in a particular case a fractional microampere passed through the system for a relatively long period of time will produce the bonding film, as will a milliampere passed for 0.6 second. The times will vary according to the current. Similarly where to produce a bond with a current of 1 microampere would require passage of the current for approximately 10 minutes, if a current of 20 microamperes is passed through the system, only about 30 seconds are required to form a bond.

A specific example of the bonding of silicon to borosilicate glass is given above. As an example of bonding silicon to quartz glass a current of approximately 10 microamperes/mm.$^2$ for one minute is employed the temperature being in the range of between about 700° C. and 1200° C. As noted above where the insulator is Pyrex glass the temperature range may be from 300° C. to 700° C., although temperatures as low as 150° C. and as high as about 800° C. may be used in some instances. The temperature for soft glass while in approximately the same range generally will be somewhat lower to avoid fusion, and for glass of the ceramic type such as porcelain the ranges applicable to Pyrex are suitable. In any event the temperature employed should be below the fusion temperature of the glass. As heretofore pointed out the requirement is that the temperature be such as to render the normally high resistance material slightly conductive electrically and capable of passing a low current. Normally even with the insulator at an elevated temperature a considerable voltage is required in the range of several hundred up to perhaps more than 1000 volts to produce the desired amperage, depending, of course, upon such factors as the character of the insulator and its thickness.

The present invention may advantageously be employed in packaging electronic components. In some forms of hybrid integrated circuits, it is desirable to attach a number of discrete semiconductor chips to an insulating substrate and subsequently interconnect them or to interconnect and encapsulate a plurality of silicon monolithic circuits on a single substrate. The present invention provides a simple means for accomplishing both steps. The method may further be used for encapsulating silicon semiconductor devices, especially of the planar variety, by bonding an insulating plate to the planar surface of the device. Although semiconductor-insulator bonds are stressed in the illustrative description of the present invention, bonding of more highly conductive metals to insulators is attained by the same method and have particular application to the glass-to-metal seal area.

Referring now to FIGURES 1 and 1*a* which show the invention in its simplest aspect, semiconductor chip 10 is placed on a resistance heated strip 11. Insulator plate 12 is placed on semiconductor chip 10 and a light pressure contact 13 is placed on insulator 12. Pressure contact 13 is connected to a negative pole of a D.C. power supply 15, and resistance heated strip 11 is connected to a positive pole 16 of the D.C. power supply 15. In obtaining a bond between the semiconductor and insulator, the system is heated until the insulator is slightly conductive. A small positive current is then passed from the semiconductor to the insulator thereby forming anodically grown bond 17. Neither material undergoes melting either by the heat or the current. The heating renders the insluator conductive. The bonding is effected solely by the step of passing a positive electric current from the conductor or semiconductor to the insulator. In the specific example the heating is affected through a resistance plate 11 connected to a suitable electric power source 18. However, other common heating means such as a gas or electric oven may be employed for the purpose. Normally the heat will be maintained while the bonding from current source 15 is being effected particularly if the conditions employed comprise a low current and a substantial period of time. In the diagrammatic showing of FIGURE 1 the bonding circuit is indicated as a power source supplying a steady direct current, which as commonly referred to, is in the direction from the semiconductor 10 to the insulator 12, that is the semiconductor is connected to the positive pole and comprises the anode and the insulator is negative or the cathode. With certain insulators such as the borosilicate glass referred to in the example this orientation of the electrical poles and direction of current has been found to be the most effective. It may be considered that this effectiveness results, at least in part, from the polarization of the borosilicate glass by reason of the current flow at the points of contact. Instead of a steady direct current a pulsating current may be employed.

Also, an A.C. source may be employed under certain limited conditions including particularly a low frequency below about 50 cycles per second. Bonding with the use of A.C. is more readily achieved with an unoxidized semiconductor as distinguished from one bearing an oxidized surface derived in the formation of the semiconductor element. Since the bonding phenomena are not reversed by or impeded by the use of alternating current and the bonding proceeds with the use of such current of reversing polarity, it appears that the bonding is not degraded or destroyed by such reversal of polarity and perhaps the bonding may indeed be extended and continued during the reverse polarity phase of the alternating current.

It will be understood that when the expression is used herein of "passing a positive electric current" from a first component to another component, it is meant that said first component is the anode or positive side, and that the current is flowing in the direction opposite to the direction of electron flow as conventionally described, and furthermore that the current may be continuous or intermittent.

Although the exact phenomenon which takes place, and the precise character of what has been referred to as the bonding film, have not been determined, certain physical manifestations have been observed which can be pointed out. In the bonding of borosilicate glass and silicon it has been noted in looking down upon the insulator as bonding proceeds, that certain changes in appearance occur progressing laterally in the bonding region indicating that the bonding occurs progressively at the interface from the initial points of contact. As will be readily understood, even with materials having very smooth surfaces, when they are brought together there is initially intimate contact at only spaced points. FIGURE 1*a* is an enlarged scale cross section of an interface between elements such as are indicated in FIGURE 1 and illustrating a typical case in which there is initially a point contact at the area indicated at P, with a gap G between the opposed areas A and B of the semiconductor 10 and the insulator 12 respectively. The gap may be of varying thickness and while extremely thin is nevertheless appreciable. In FIGURE 1*a* the relation is, of course, considerably magnified for clarity.

Normally there will be a plurality of such points P and air gaps G. The extent if any to which local plasticity of the materials cooperate has not been determined. At any rate, when electric potential is applied across the lamination, bonding is effected and progresses with formation of a bonding interface. It appears with reference to FIGURE 1*a* that polarization occurs and an electrostatic attractive force is set up between areas A and B at P and closely adjacent thereto which tends to draw the members together at those areas and a bond is effected. This phenomenon progresses on to other areas as evidenced by the progressive disappearance of interference fringes and bonding occurs at all areas as they come into close intimate contact so that a close hermetic seal is obtained throughout the interface. Of course, it is still important that the common surfaces be in at least close promixity at all areas. Thus with planar surfaces they should be smooth and complemental over the areas desired to be bonded.

Reference has been made to "anodic bonding" and to a "bonding film" and to the "bond," and in FIGURE 1 there is shown a layer 17 as a distinct zone contrasting in appearance with the material of the semiconductor 10 and the insulator 12. It is believed an oxide is formed at the interface as a distinct reaction product resulting from the electric current but because the bonding area or zone is of such minute thickness it is impossible or at least most difficult to determine with any degree of certainty the exact physical or chemical change occurring in that region or zone. Measurements made indicate that the bonding region or zone may extend to a depth in the order of 20 to 200 Angstroms. Any attempted analysis is complicated further by the fact that an oxide quickly forms on silicon when exposed to oxygen present in the atmosphere or liberated near the surface of the silicon.

At any rate, bonding accomplished according to the process of this invention produces at the interface between the insulator and semiconductor or conductor a bonding region or layer comprising a composition which is different from that of the semiconductor or conductor and the insulator and which is of higher resistivity than the insulator beyond the bonding region. This has schematically been shown in FIGURE 1 as a layer 17, but it may not be assumed that the bonding region is a homogeneous layer or a layer of constant composition, rather it is a bonding or transition region created by the passage of current under temperature conditions whereby the insulator is rendered conductive and electrostatic attraction occurs in the vicinity of the point of contact. Accordingly when reference is made herein to a film or bonding film at the interface there is meant a region or layer at the interface which is formed or modified in some manner by the passing of the electric bonding current such as to cause the insulator and the semiconductor or conductor to be hermeticaly sealed together by a strong bond throughout. Likewise by anodic bonding there is meant the bonding which results when an electric potential is applied across the juxtaposed elements and electric current flows under the conditions described resulting in a bonding medium of some kind at the interface of the juxtaposed elements which is the result of the electric current flow.

Preferably the semiconductor or metal and the insulator should have a similar thermal coefficient to reduce the liability of separation on cooling or temperature cycling of the unit. Silicon and certain glasses including particularly Pyrex comprise an ideal combination in this respect having coefficients which are close in value. In general separation is less liable to occur in the case of a ductile metal. Also, in any case slow cooling helps to avoid separation.

In a specific example employing borosilicate glass ("Pyrex" No. 7740) and silicon the bonding current was 10 microamperes/mm.$^2$ for a period of 20 minutes and the temperature was about 400° C.

In a typical example where quartz glass is used as the insulator and the semiconductor is silicon the system was heated to approximately 900° C. and the electric current was approximately 10 microamperes/mm.$^2$ for approximately one minute. As another example with these materials a current of 4 microamperes/mm.$^2$ for approximately 20 minutes at about 900° C. produces bonding.

The general application of the principles of the invention is illustrated by further examples selected from many which have been performed in each of which a firm strong hermeticaly sealed bond resulted.

A germanium semiconductor was bonded to borosilicate glass by a method generally illustrated by FIGURE 1, the conditions being approximately a bonding current of 3 microamperes/mm.$^2$ for 2 minutes at 450° C.

As examples of other insulator materials a silicon semiconductor was bonded to a soft glass insulator using 5 microamperes/mm.$^2$ for 4 minutes at 450° C. Also a silicon semiconductor was bonded to a sapphire insulator using 1 microampere for 1 minute at 650° C.

In another example a semiconductof of gallium arsenide was bonded to soft glass using 25 microamperes for 3 minutes at 450° C.

Figure 2:
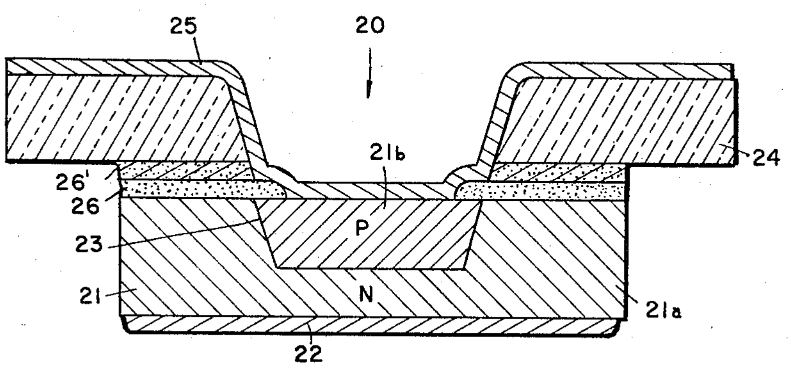
FIGURE 2 is a cross-sectional view of a planar diode encapsulated by anodic bonding.

In FIGURE 2 a planar diode 20 encapsulated by the present invention is shown. The fabrication of this device represents almost the utmost in simplicity. A suitable semiconductor such as a single crystal silicon material is prepared in slice form by techniques which are well known in the art. Slice 21 from which planar diode 20 is to be fabricated is subjected to diffusion heat treatment using a significant impurity to produce p-n junction 23 at a prescribed distance from one surface. Specifically, the lower or major portion **21*a* of slice 21, which serves as a cathode, is of n-type conductivity silicon. A p-type impurity such as boron is diffused into one face of the slice to convert a surface portion 21*b* to a p-type conductivity. P-type conductivity portion 21*b* serves as the anode. An insulating plate 24 is placed on the oxidized surface 26 of silicon slice 21. The insulating plate 24** is preheated by suitable means such as indicated in FIGURE 1.

Figure 7:
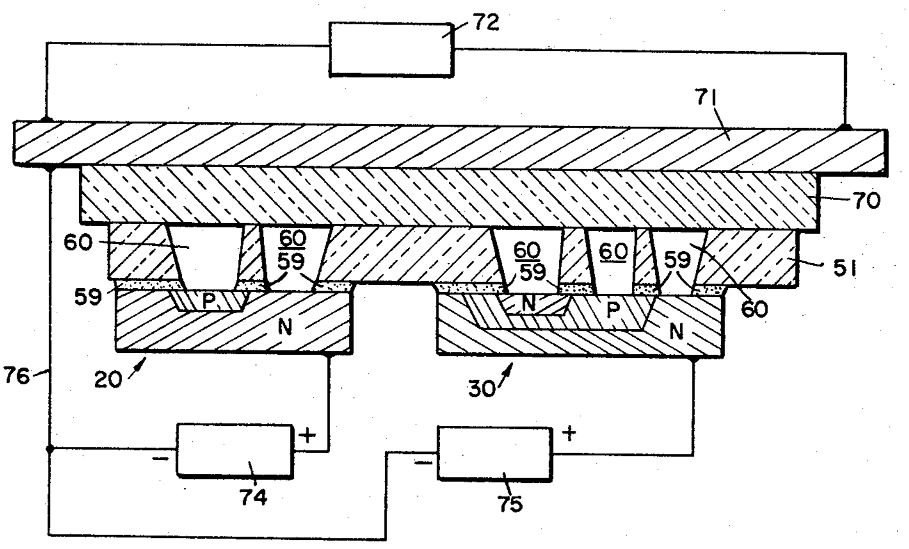
FIGURE 7 is a cross-sectional view of the planar diode and transistor of FIGURE 6 illustrating an initial step in forming the article of FIGURE 6 according to one technique.

While in FIGURE 2 the glass 24 is shown as extending to approximately the projection of the p-n junction it is generally preferred to extend the glass portion somewhat beyond the p-n junction to provide maximum protection of the junction as is clearly shown for example in FIGURE 7.

An electric potential is applied to the components which may be of a character similar to that of FIGURE 1 and as the current passes through the unit a bonding film or zone is formed indicated at 26′. It will be understood that the so-called films 26 and 26′ are greatly exaggerated in thickness and in being indicated as distinct separate layers whereas these areas in the final product are physically indistinguishable from each other by any common or simple analytical techniques.

An anode lead is brought to the outside of the device by means of a metal film 25 evaporated through an aperture in insulating plate 24 after the bonding process. The apertures in the insulating plate may be formed prior to or after the bonding process. Metal film 25 is continuous on the surface of insulating plate and thus also serves as an anode contact. A cathode contact 22 is provided by means of a metal film evaporated on the n-portion **21*a* of slice 21**.

The resulting package is an extremely simple and easily manufactured device with the following advantages: the junction is hermetically sealed in an insulator; only two piece parts are required, there is minimum volume, area and weight; the silicon may be attached directly to a heat sink for improved heat transfer.

Figure 3:
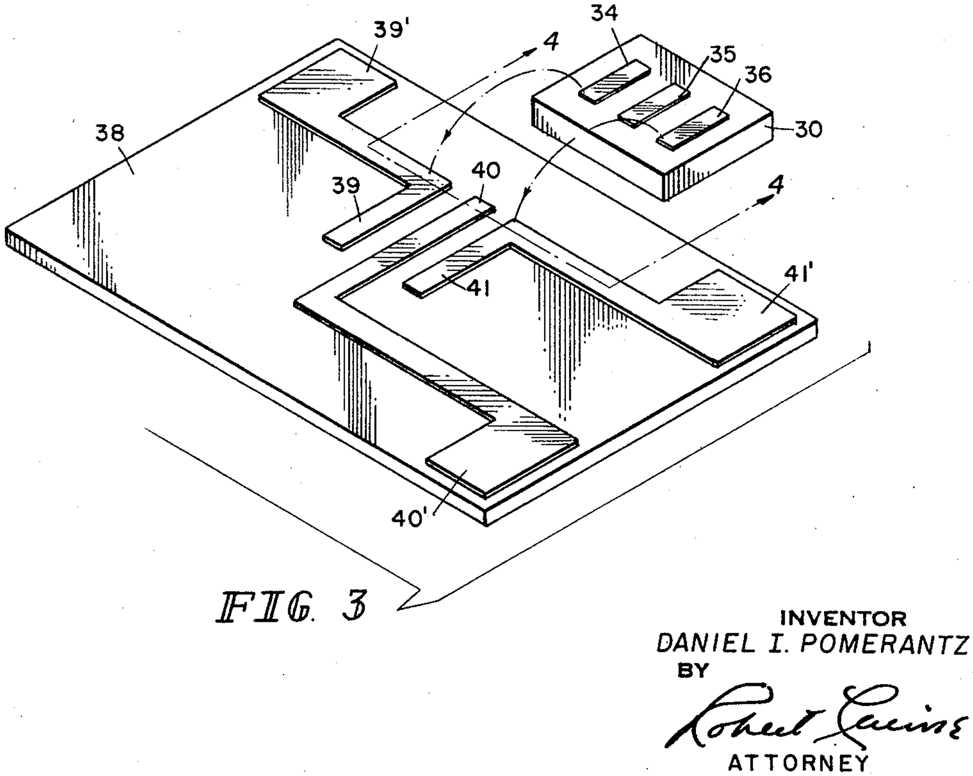
FIGURE 3 is a pictorial view of a transistor chip and the metallized insulating block prior to alignment and anodic bonding.

In FIGURE 3 the relationship between a silicon transistor chip, the metallized substrate and the external leads is clearly shown. Silicon chip 30 has metallized connections 34, 35 and 36 which are to be registered on corresponding metallized connections 39, 40 and 41 of insulating substrate 38 respectively. Metallized connections 39, 40 and 41 extend on substrate 38 to form external leads 39′, 40′ and 41′ respectively.

Figure 4:
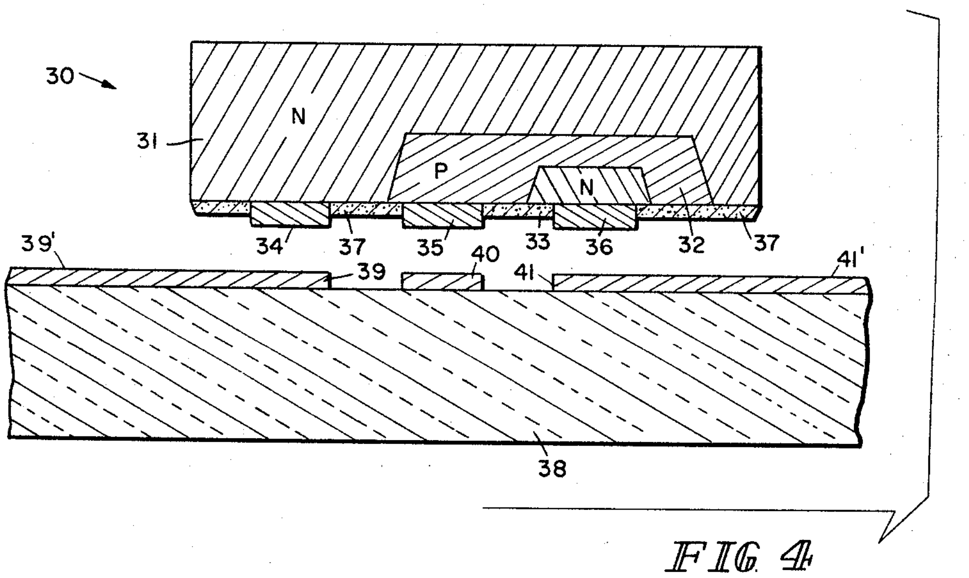
FIGURE 4 is a cross-sectional view of a silicon transistor chip and a metallized insulator prior to anodic bonding taken through section 4—4 of FIGURE 3.

In FIGURE 4 the silicon transistor chip 30 is shown prior to bonding to insulating substrate 38. Transistor chip 30 is prepared with metallized contacts 34, 35 and 36 contacting the collector 31, base 32 and emitter 33 regions respectively. The remaining areas are normally protected by an insulating layer 37 of silicon dioxide grown during the fabrication of the device. Insulating substrate 38 has metallized contacts 39, 40 and 41 evaporated thereon. Pyrex glass metallized with aluminum has been found to be an excellent combination. Transistor chip 30 is registered on insulating substrate 38 so that metallized areas 34, 35 and 36 of the chip contact the corresponding metallized areas 39, 40 and 41 respectively of the substrate. The transistor chip 30 and insulating substrate 38 are then sealed by anodic bonding in the manner such as illustrated in the more simple combinations of FIGURES 1 and 2. Although the metallized pairs of connections 34, 39 and 35, 40 and 36, 41 are in direct contact respectively it has been found in actual operation that it does not result in short circuiting of the bonding circuit therethrough, at least to the extent of preventing the formation of the bonding film, due probably to the higher resistivity of the glass adjacent the bonding region. As current flows through areas in electric contact the glass adjacent such areas becomes impoverished in positive ions by reason of ionic migration, and a region within the glass adjacent such areas having increased resistivity is formed, and hence the current is diverted to laterally adjacent areas of lower resistivity and bonding is progressively effected.

Figure 5:
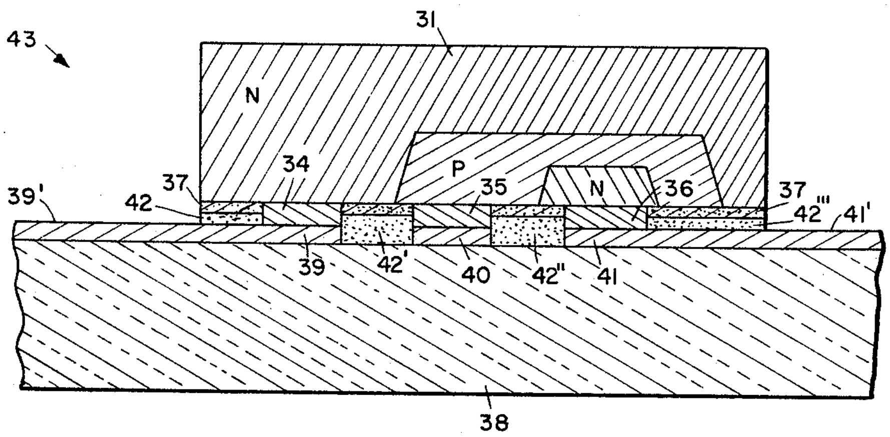
FIGURE 5 is a cross-sectional view of the completed encapsulated transistor.

FIGURE 5 is a sectional view of the completed transistor unit embodying the components of FIGURES 3 and 4. It includes a showing of the oxide layer areas 37 referred to above as grown during fabrication. It will be understood that according to this invention the bonding can also be carried out on a surface free from oxide. Areas 42, 42′, 42″ and 42‴ indicate the anodically formed bond which here again are shown as distinct layers and in exaggerated dimension for clarity of description. Metallized portions 39, 40 and 41 on substrate 38 extend past transistor 30 thereby providing external contacts. In the practice of the present invention, it is not necessary to metallize the semiconductor slice. It is sufficient to leave discrete apertures in the oxide film, if one is present, exposing the appropriate areas of silicon. The aluminum from the substrate makes contact with the silicon areas, thus one step, the metallizing of the semiconductor chip, can be eliminated.

Figure 6:
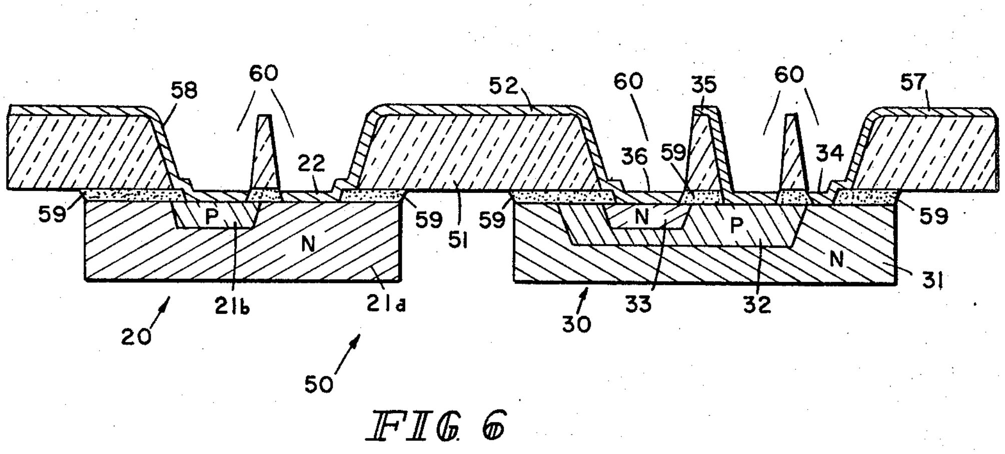
FIGURE 6 is a cross-sectional view of a planar diode and a transistor encapsulated and interconnected by anodic bonding.

FIGURE 6 represents either of two techniques for interconnecting different silicon elements on a substrate. On the one hand, silicon elements 20 and 30 may be individually mounted as shown. On the other hand, a semiconductor slice 50 containing a plurality of devices may be bonded to an insulating substrate 51 on which a metallized pattern has been deposited to interconnect the different devices according to a predetermined circuit. After bonding, the regions of semiconductor in between different devices are removed by etching or any other suitable process to isolate the various semiconductor devices from one another. This eliminates the necessity of individually mounting and registering each device. This scheme may further be utilized to interconnect and encapsulate a plurality of silicon monolithic circuits.

For illustrative purposes a sectional view of a portion of a completed silicon integrated circuit 50 comprising planar diode 20 as described in FIGURE 2 and a transistor 30 as described in FIGURE 3 which have been interconnected and encapsulated are shown in FIGURE 6. Insulating substrate 51 has apertures 60 therein so that metallized portions of substrate 51 can contact appropriate sections of silicon on the various devices. Metal contact 52 connects cathode **21*a* of diode 20 to the emitter 33 of transistor 30. Metal contact 35 provides an external contact for base 32 of transistor 30 and contact 57 provides an external contact for collector 31 of transistor 30. Similarly, contact 58 provides an external contact for anode 21*b* of diode 20. Anodically grown film 59** bonds the silicon to the substrate. The metallizing and isolating of the various devices on the slice are carried out after the bonding process.

As described above FIGURE 6 represents either of two techniques for connecting different semiconductors on a substrate. FIGURE 7 illustrates the initial step in one such technique. Insulator substrate 51 has the preformed openings 60 of the final product of FIGURE 6. It is in close planar contact with the individual semiconductors 20 and 30. The substrate 51 preferably has applied thereto a glass plate 70 for electric current distribution of the several portions of substrate 51, and applied to the plate 70 is the resistive heater strip 71 with its source of electric power 72. The individual semiconductors 20 and 30 each has its independent electric current bonding source indicated at 74 and 75 respectively. If desired they may have a common negative line 76. Line 76 is shown in the set-up of FIGURE 7 as connected to the resistive heater strip 71 which is electrically connected to substrate 51 through the current distribution plate 70. As described above in connection with FIGURE 6, application of the bonding currents to the respective semiconductors produces the anodically grown bonding film 59. In the drawings the film 59 may be regarded as comprising the anodically formed bonding film together with any initial oxide film on the silicon. Following the bonding operation the heater strip 71 and glass plate 70 are of course removed and the metallized pattern 52 is applied having the contacts 58, 35 and 57 illustrated in FIGURE 6.

Figure 8:
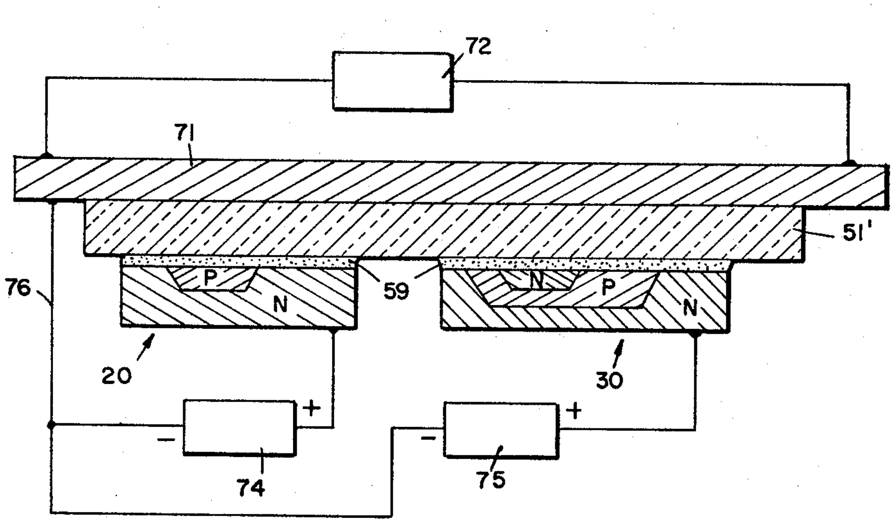
FIGURE 8 is a view similar to FIGURE 7 illustrating an initial step in forming the article of FIGURE 6 employing a somewhat different technique.

FIGURE 8 illustrates the initial step in another technique for arriving at the device of FIGURE 6. In this case, the substrate indicated at 51′, is a solid continuous plate without initially the openings 60, and accordingly the glass distribution plate 70 is omitted. Otherwise the system is similar to that of FIGURE 7 and similar parts bear similar reference characters. Following the formation of the bonding fim 59 the openings 60 are formed as by etching or other suitable means and the metallized pattern 52 is applied which includes the contacts or leads 58, 35 and 57 of FIGURE 6.

As a modification of the techniques of FIGURES 7 and 8 the semiconductor such as the silicon elements 20 and 30 may initially constitute a single integral slice. The initial set-up could then be either like that of FIGURE 7 of FIGURE 8 as desired except that only one bonding circuit (74 or 75) would be required. After the bonding the area of the silicon slice connecting elements 20 and 30 is removed by etching or other means whereby they are electrically isolated from each other and further steps taken as with the techniques described in connection with FIGURES 7 or 8 as the case may be.

The examples heretofore described concern bonding to an insulator a type of component commonly referred to as a semiconductor and having normally a resistivity to electric current in a range considerably higher than metals for example. In addition, however, to applications with semiconductor devices, the anodic bonding process has been found to work in bonding both aluminum and platinum to glass along with a number of other metals, particularly the valve metals. The process has been carried out utilizing a number of insulating materials including glass, quartz and alumina. The process may be carried out in air or in various oxidizing atmospheres, or in a vacuum.

The following examples illustrate the bonding of electrically conducting metals to an insuator, employing in each case a system generally similar in arrangement and principle to that of FIGURE 1, the values given being approximate.

Sheet aluminum was bonded to borosilicate glass using a bonding current density of 1 microampere/mm.$^2$ for 10 minutes at a temperature of 400° C.

Platinum foil was bonded to soft glass employing a bonding current of 5 microamperes/mm.$^2$ for 7 minutes at a temperature of 400° C.

Sheet beryllium was bonded to glass employing a bonding current of 25 microamperes/mm.$^2$ for 5 minutes at 400° C., and sheet titanium was bonded to glass under similar values of current, time and temperature.

In the ceramic type of glass insulators, palladium was bonded to porcelain employing a bonding current of 100 microamperes/mm.$^2$ for 5 minutes at 400° C.

It will thus be seen that the invention is adapted to bonding of various insulator materials to various metals of the semiconductor and conductor types. The applicable insulator materials are particularly of the glass type, including ceramic and quartz insulators. As to the metals, the invention is, as has been shown, applicable to a wide range of semiconducting and conducting metals.

The present invention has a number of advantages. Among the major ones are:

(1) To encapsulate and provide leads from the planar terials can be accomplished at lower temperatures than with competing processes such as glass-to-metal sealing;

(2) Since there is no molten phase, distortion is reduced and dimensional tolerances are improved;

(3) Since the bonding can be made to take place at relatively low temperatures, materials of different thermal expansion coefficient can be attached with less danger of cracking since they do not have to be cooled from such a high temperature, thus thin aluminum below about four mils in thickness has been bonded to glass although its thermal expansion is almost four times as great. Many other metals not normally thought to be sealable to glass may be usable in such applications by virtue of this factor.

The hereinabove invention has a number of applications. In the silicon semiconductor device field, it has been utilized:

(1) To encapsulate and provide leads from the planar surface of a single device; and (2) To mount, encapsulate the planar surfaces, interconnect and provide leads from a plurality of separate devices on a single substrate.

The invention may be utilized to mount, encapsulate the planar surfaces, interconnect and provide leads from a plurality of silicon monolithic integrated circuits on a single substrate.

Other applications will be apparent to those skilled in the art.

Two alternative methods of providing the interconnections and leads are dscribed. For example, one method is by forming discrete apertures in the substrate, registering the substrate so that the apertures expose appropriate contact areas on the planar surface of the device, devices or circuits and evaporating the metal contacts and leads thereon after the bonding process. A second method is by providing metallized contacts on the contact areas of the planar surfaces or exposing discrete areas of silicon, providing corresponding metallized contacts on the substrate, registering the device or devices and the substrate prior to bonding so that the corresponding contacts or contact-silicon areas are registered and bonding so as to effect encapsulation and electrical contact. In the latter instance, the substrate is substantially larger than the silicon chip and the contacts on the substrate terminate in external leads on the area of the substrate extending beyond the chip.

If necessary, the non-planar surface of the device is metallized to provide an additional contact. When a plurality of separate devices or circuits are to be interconnected and encapsulated, they may either be formed on a single slice and isolated by etching, machining or some other appropriate method after bonding or they may be individually registered on the substrate.

It can be seen that the present invention has a wide scope of applications and as hereinabove described and in its representative embodiment is merely illustrative and not exhaustive in scope. Since many widely differing embodiments of the invention may be made without departing from the scope thereof, it is intended that all matters contained in the above description and shown in the accompanying drawing shall be interposed as illustrative and not in a limiting sense.

Having thus described my invention, I claim:

1. A method of bonding an inorganic insulator element of normally high electrical resistivity to a metallic element comprising juxtaposing said elements in surface contact, the adjoining surfaces being substantially smooth and complemental but having points of contact and appreciable gaps, heating said insulator element to a temperature below its fusion point sufficient to render it electrically conductive, applying an electric potential across the juxtaposed elements to pass an electric current through said points of contact and create an electrostatic field between the adjoining surfaces causing the juxtaposed elements to be attracted into intimate contact progressively to close said gaps and form a bond between said adjoining surfaces.

2. A method of bonding an insulator element of normally high electrical resistivity inorganic material to a metallic element comprising juxtaposing said elements in surface contact relationship, the adjoining surfaces being substantially smooth and complemental, heating said insulator element to a temperature below its fusion point sufficient to render it electrically conductive, and applying an electrical potential across the juxtaposed elements whereby said juxtaposed elements are drawn into intimate contact with each other without exertion of substantial mechanical pressure on said juxtaposed elements and a bond is formed between said elements.

3. A method of bonding an insulator element of normally high electrical resistivity inorganic material to a metallic element comprising juxtaposing said elements in surface contact relationship, the adjoining surfaces being substantially smooth and complemental, heating said insulator element to a temperature below its fusion point sufficient to render it conductive of electric current, and applying an electric potential across the juxtaposed elements sufficient to produce a finite electric current of low amperage density through the juxtaposed elements thereby to produce an electrostatic field across the adjoining surfaces and effecting a bond between the elements in a period of not more than about 20 minutes while the insulator element is at the said electrically conducting temperature.

4. A method of bonding an insulator element of normally high electrical resistivity inorganic material to a metallic element comprising juxtaposing said elements in surface contact relationship, the adjoining surfaces being substantially smooth and complemental, heating said insulator element to a temperature below its fusion point sufficient to render it electrically conductive, and applying an electric potential across the juxtaposed elements through an electrical terminal in electrical contact with said juxtaposed elements, said potential being sufficient to produce a finite electric current of low amperage density through the juxtaposed elements thereby to produce an electrostatic field across the adjoining surfaces and effect a bond between the elements.

5. A method in accordance with claim 1, wherein said temperature is from about 150° C. to about 1200° C.

6. A method in accordance with claim 5, wherein said insulator element is selected from the group consisting of glass, quartz and alumina.

7. A method according to claim 6, wherein said metallic element is selected from the group consisting of aluminum, beryllium, gallium arsenide, germanium, palladium, platinum and silicon.

8. A method according to claim 7, wherein said insulator element is glass.

9. A method according to claim 8, wherein said metallic element is silicon.

10. A method according to claim 8, wherein said metallic element is aluminum.

11. A method according to claim 9, wherein said glass is a borosilicate glass.

12. A method according to claim 7, wherein said potential is D.C. and applied to pass a current from said metallic element to said insulator element.

13. A method in accordance with claim 2, wherein said insulator element is a glass, said metallic element is selected from the group consisting of aluminum, beryllium, gallium arsenide, germanium, palladium, platinum and silicon, and said temperature is from about 150° C. to about 1200° C.

14. A method in accordance with claim 3, wherein said insulator element is a glass, said metallic element is selected from the group consisting of aluminum, beryllium, gallium arsenide, germanium, palladium, platinum, and silicon, and said temperature is from about 150° C. to about 1200° C.

15. A method in accordance with claim 4, wherein said insulator element is a glass, said metallic element is selected from the group consisting of aluminum, beryllium, gallium arsenide, germanium, palladium, platinum and silicon, and said temperature is from about 150° C. to about 1200° C.

16. A method of encapsulating a p–n junction of a silicon semiconductor device having a planar surface and providing leads therefrom comprising the steps of:

(a) placing an insulating substrate in contact with the planar surface of said device, said substrate having discrete apertures therein for providing electrical leads from said device, said apertures being aligned with contact areas of said device;

(b) heating said substrate to a temperature below its fusion point sufficient to render it electrically conductive;

(c) applying an electric potential across said substrate and said device to pass an electric current through the contacting elements thereby to produce an electrostatic field across the contacting elements and effecting a bond between said device and said substrate; and (d) metallizing discrete areas of said substrate, said metallizing extending to said contact areas of said device exposed by said apertures, thereby providing leads therefrom.

17. A method of encapsulating a p–n junction of a silicon semiconductor device having a planar surface to an insulating substrate and providing a lead from said device comprising the steps of:

(a) placing said substrate contiguous said planar surface of said device;

(b) heating said substrate to a temperature below its fusion point sufficient to render it electrically conductive;

(c) applying an electric potential across said device and said substrate to pass an electric current therethrough thereby to produce an electrostatic field across said device and said substrate and effecting a bond therebetween;

(d) forming an aperture in said substrate for a lead to a contact area of said planar surface of said device; and (e) metallizing a discrete area of said substrate, said metallizing extending to said contact areas of said planar surface of said device exposed by said aperture in said substrate thereby providing a lead therefrom.

18. A method for mounting and encapsulating the planar surfaces of a plurality of separate silicon semiconductor devices on a single insulating substrate and providing electrical interconnection therebetween and external leads therefrom comprising the steps of:

(a) placing the insulating substrate contiguous said planar surfaces of said devices;

(b) heating said substrate to a temperature below its fusion point sufficient to render it electrically conductive;

(c) applying an electric potential across said substrate and said device to pass an electric current therethrough and effecting a bond between said substrate and each of said devices; and (d) providing electrical leads from said devices on said substrate including electrical interconnection.

19. A method for mounting a plurality of silicon monolithic integrated circuits on a single insulating substrate and providing electrical interconnection therebetween and external leads therefrom comprising the steps of:

(a) placing an insulating substrate having a discrete metallized pattern thereon contiguous a planar surface of said monolithic circuits so that metallized contacts of said pattern are in electrical connection with said monolithic circuits, said pattern also interconnecting said monolithic circuit and providing leads therefrom;

(b) heating said substrate to a temperature below its fusion point sufficient to render it electrically conductive; and (c) applying an electric potential across said monolithic circuits and said substrate to pass a positive electric current from said monolithic circuits to said substrate thereby effecting a bond therebetween and holding said metallized pattern of said substrate in electrical contact with said monolithic circuits.

20. As an article of manufacture an inorganic insulator element of normally high electrical resistivity bonded to a metallic element, said article formed according to the process of claim 1.

21. An article of manufacture according to claim 20, wherein said insulator element is selected from the group consisting of glass, quartz and alumina and said metallic element is selected from the group consisting of aluminum, beryllium, gallium arsenide, germanium, palladium, platinum and silicon.

22. An article of manufacture according to claim 21, wherein said insulator element is a glass and said metallic element is silicon.

23. As an article of manufacture an encapsulated p-n junction of a silicon semiconductor device having a planar surface and leads provided therefrom, said device formed according to the method of claim 16.

References Cited

UNITED STATES PATENTS

| | | | |
|---|---|---|---|
| 3,256,598 | 6/1966 | Kramer et al. | 156—272 |
| 2,567,877 | 9/1951 | De Ment | 204—16 |

OTHER REFERENCES

Handbook of Chemistry and Physics, 44th edition, 1961, p. 2627.

JOHN H. MACK, *Primary Examiner.*

T. TUFARIELLO, *Assistant Examiner.*